(12) United States Patent
Tanaka

(10) Patent No.: US 7,013,369 B2
(45) Date of Patent: Mar. 14, 2006

(54) MEMORY CONTROL CIRCUIT OUTPUTTING CONTENTS OF A CONTROL REGISTER

(75) Inventor: Hitoshi Tanaka, Kanagawa (JP)

(73) Assignee: Oki Electric Industy Co., Ltd., Tokyo (JP)

( * ) Notice: Subject to any disclaimer, the term of this patent is extended or adjusted under 35 U.S.C. 154(b) by 167 days.

(21) Appl. No.: 10/119,122

(22) Filed: Apr. 10, 2002

(65) Prior Publication Data
US 2002/0152351 A1 Oct. 17, 2002

(30) Foreign Application Priority Data
Apr. 16, 2001 (JP) .............................. 116600/2001

(51) Int. Cl.
G06F 12/00 (2006.01)
(52) U.S. Cl. ...................... 711/154; 711/202
(58) Field of Classification Search ................ 711/154, 711/105, 202; 370/477, 521; 375/240
See application file for complete search history.

(56) References Cited

U.S. PATENT DOCUMENTS 6,519,733 B1 * 2/2003 Har et al. ................... 714/758

* cited by examiner

Primary Examiner—Matthew Kim
Assistant Examiner—Hetul Patel
(74) Attorney, Agent, or Firm—Volentine Francos & Whitt, PLLC

(57) ABSTRACT

A memory control circuit includes a control register having a memory capacity of m bits or smaller for setting information necessary for controlling the memory, input pins to which m-bit test data is input in parallel, an extension circuit for extending the data input to the input pins to n-bit data, and a first selection section for selectively inputting n-bit data supplied from the extension circuit or a CPU based on a mode signal to switch between a test mode and a normal mode. The memory control circuit further includes a degeneration circuit for compressing n-bit data to be output in parallel to the CPU to m-bit data, a second selection section for selecting m-bit data compressed by the degeneration circuit or lower m-bit data in n-bit data to be output to the CPU based on a switch signal, and output pins for outputting the m-bit data selected by the second selection section in parallel.

18 Claims, 3 Drawing Sheets

MEMORY CONTROL CIRCUIT OUTPUTTING CONTENTS OF A CONTROL REGISTER

BACKGROUND OF THE INVENTION

The present invention relates to a memory control circuit which controls read access, accesses for reading, writing and so forth to a memory, such as a dynamic random access memory (hereinafter called "DRAM").

A conventional memory control circuit has a core circuit which is provided between a central processing unit (hereinafter called "CPU") and a DRAM and executes controls on the DRAM, such as refresh control, precharge control and access control in burst mode, in place of the CPU.

Further, the memory control circuit has test circuits respectively provided between the CPU and the core circuit and between the core circuit and the DRAM to test the functions of the core circuit.

Each test circuit includes an extension circuit which extends input test data of 8 bits to 32 bits, 4 times the size of the input test data, a selector which selects the extended data and data from the CPU or the DRAM and sends the selected data to the core circuit, and a degeneration circuit which compresses 32-bit data from the core circuit to 8-bit data and outputs the 8-bit data.

The core circuit has a control register of about 8 bits to set information, such as the capacity of the DRAM to be controlled and a bit width at the time of making access. Of 32-bit data to be input to the core circuit, lower 8-bit information is written in the control register. The contents of the control register become lower 8 bits in 32-bit data that is output from the core circuit.

In test mode, the extension circuit arranges 8-bit information to be set in the control register as lower data in 32-bit data and sends the resultant data to the input terminal of the core circuit. Therefore, predetermined information can be written in the control register.

In case of reading the contents of the control register in test mode, the read contents of the control register are output to lower 8 bits of 32-bit data of the output terminal of the core circuit. The 32-bit data output from the output terminal are compressed to 8-bit data by the degeneration circuit.

The degeneration circuit carries out data compression by performing logical calculation using 32-bit data, not simply discarding other bits than the lower 8 bits. This disables readout of the contents of the control register from. the degeneration circuit.

SUMMARY OF THE INVENTION

Accordingly, the invention may provide a memory control circuit which overcomes the problem of the prior art and may check the contents of a control register even when the number of input/output pins for a functional test are reduced.

A memory control circuit according to the present invention includes a control register having a memory capacity of m bits or smaller for setting information necessary for controlling the memory, input pins to which m-bit test data is input in parallel, an extension circuit for extending the data input to the input pins to n-bit data, and a first selection section for selectively inputting n-bit data supplied from the extension circuit or a CPU based on a mode signal to switch between a test mode and a normal mode. The memory control circuit further includes a degeneration circuit for compressing n-bit data to be output in parallel to the CPU to m-bit data, a second selection section for selecting m-bit data compressed by the degeneration circuit or lower m-bit data in n-bit data to be output to the CPU based on a switch signal, and output pins for outputting the m-bit data selected by the second selection section in parallel.

DETAILED DESCRIPTION OF THE PREFERRED EMBODIMENTS

Figure 1:
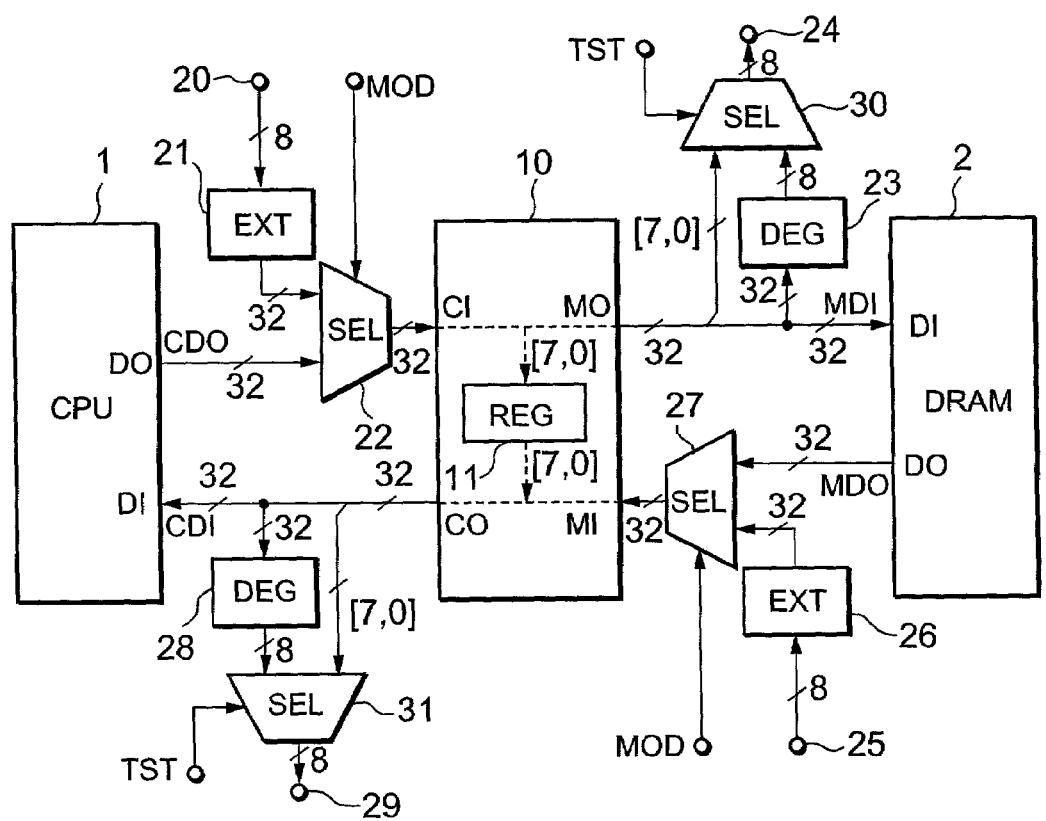
FIG. 1 is a block diagram of a memory control circuit showing a first embodiment of the invention.

FIG. 1 is a block diagram of a memory control circuit showing a first embodiment of the invention. To simplify the description and clarify the points of the invention, address signals and control signals that do not directly related to the invention are not illustrated in this diagram.

The memory control circuit has a core circuit 10 which is provided between a CPU 1 and a DRAM 2 and executes controls on the DRAM 2, such as refresh control, precharge control and access control in burst mode, in place of the CPU 1.

Further, the memory control circuit has test circuits (which will be discussed below) respectively provided between the CPU 1 and the core circuit 10 and between the core circuit 10 and the DRAM 2 to test the functions of the core circuit 10.

Figure 2:
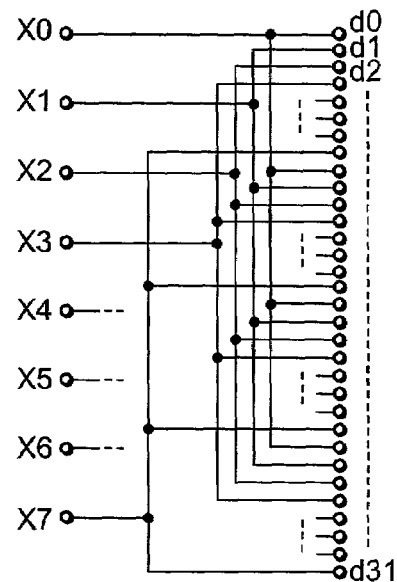
FIG. 2 is a circuit diagram showing an extension circuit in FIG. 1.

One test circuit has input pins 20 for inputting 8-bit test data in parallel. The input pins 20 are connected to an extension circuit (EXT) 21. As shown in FIG. 2, the extension circuit 21 extends 8-bit data X0 to X7 to 32-bit data d0 to d31, 4 times the size of the input data. In the extension circuit 21, the 8-bit data X0 to X7 are connected as a wired OR circuit in such a way that each piece of data Xi (i=0 to 7) is output as data di, di+8, di+16 and di+24, i.e., the data X0 is extended to four pieces of data d0, d8, d16 and d24.

The output of the extension circuit 21 is connected to a first input of a selector (SEL) 22 whose second input is supplied with 32-bit output data CD0 from an output terminal DO of the CPU 1. The selector 22 is designed in such a way as to select the first input when a mode signal MOD is in test mode and to select the second input when the mode signal MOD is in normal mode. The output of the selector 22 is connected to a CPU-side input terminal CI of the core circuit 10.

Figure 3:
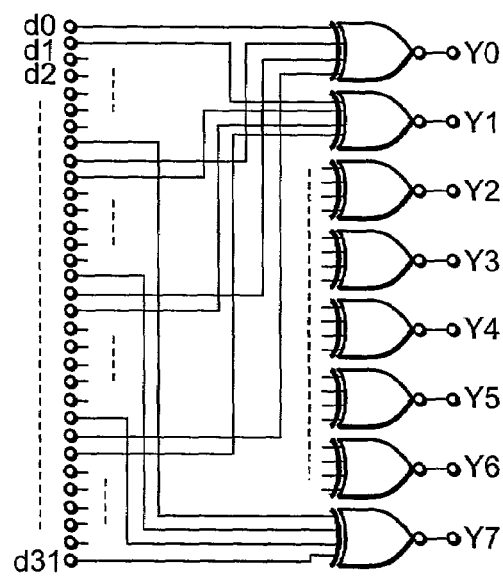
FIG. 3 is a circuit diagram showing a degeneration circuit in FIG. 1.

A memory-side output terminal MO of the core circuit 10 is connected to an input terminal DI of the DRAM 2 and the input of a degeneration circuit (DEG) 23. As shown in FIG. 3, the degeneration circuit 23 compresses 32-bit data d0 to d31 to 8-bit data X0 to X7, the opposite process of the extension circuit 21. In the degeneration circuit 23, the 32-bit data d0 to d31 are connected in such a way that 4-bit data di, di+8, di+16 and di+24 (i=0 to 7) are compressed to 1-bit data Yi by exclusive NOR (hereinafter called "ENOR") of four inputs. The output of the degeneration circuit 23 is connected to a first input of a selector 30.

Lower 8-bit data [7, 0] is supplied to a second input of the selector 30 from the memory-side output terminal MO of the core circuit 10. The selector 30 selects either the first or second input in accordance with a test signal TST. The output of the selector 30 is connected to output pins 24 for outputting 8-bit test data in parallel.

The memory control circuit further has input pins 25 for inputting 8-bit test data in parallel and an extension circuit 26 connected to the input pins 25. The extension circuit 26, like the extension circuit 21, extends 8-bit data to 32-bit data. The output of the extension circuit 26 is connected to a first input of a selector 27 whose second input is supplied with 32-bit output data MDO from an output terminal DO of the DRAM 2. Like the selector 22, the selector 27 is designed in such a way as to select the first input when the mode signal MOD is in test mode and to select the second input when the mode signal MOD is in normal mode. The output of the selector 27 is connected to a memory-side input terminal MI of the core circuit 10.

A CPU-side output terminal CO of the core circuit 10 is connected to an input terminal DI of the CPU 1 and the input of a degeneration circuit 28. The output of the degeneration circuit 28 is connected to a first input of a selector 31. Lower 8-bit data [7, 0] is supplied to a second input of the selector 31 from the CPU-side output terminal CO of the core circuit 10. The selector 31 selects either the first or second input in accordance with the test signal TST. The output of the selector 31 is connected to output pins 29 for outputting 8-bit test data in parallel.

The core circuit 10 has a control register (REG) of about 8 bits to set information, such as the capacity of the DRAM 2 to be controlled and a bit width at the time of making access. The control register 11 is connected to lower 8 bits of 32-bit data to the input terminal CI of the core circuit 11 so that the 8-bit information is written in the control register 11. The contents of the control register 11 are output to lower 8 bits in 32-bit data that is output from the output terminal CO of the core circuit 10.

The operation will now be described.

To execute a functional test on the core circuit 10, the memory control circuit sets the mode signal MOD in test mode. As a result, each of the selectors 22 and 27 is switched to the first input.

To check the control register 11 in the core circuit 10, the selectors 30 and 31 are switched to the second inputs. As a result, lower 8-bit data [7, 0] is output to the output pins 24 via the selector 30 from the memory-side output terminal MO of the core circuit 10. Further, lower 8-bit data [7, 0] is output to the output pins 29 via the selector 31 from the CPU-side output terminal CO of the core circuit 10.

Here, 8-bit test data are input in parallel from the input pins 20 and 25 to write predetermined information into the control register 11, and information written in the control register 11 is read out. The information read from the control register 11 is output as lower 8-bit data [7, 0] from the memory-side output terminal MO of the core circuit 10 or as lower 8-bit data [7, 0] from the CPU-side output terminal CO of the core circuit 10.

The lower 8-bit data [7, 0] output from the output terminal MO is output to the output pins 24 via the selector 30. The lower 8-bit data [7, 0] from the output terminal CO is output to the output pins 29 via the selector 31. Therefore, information written in the control register 11 can be checked with data output to the output pins 24 and 29.

After the function of the control register 11 is confirmed, the selectors 30 and 31 are switched to the first input side, and 8-bit test data is input in parallel from the input pins 20 and 25. The test data are extended to 32-bit data in the extension circuits 21 and 26 and the resultant 32-bit data are supplied to the input terminals CI and MI of the core circuit 10. Accordingly, 32-bit data are output from the output terminals MO and CO of the core circuit 10. The data output from the output terminals MO and CO of the core circuit 10 are compressed to 8-bit data by the respective degeneration circuits 23 and 28 and the resultant 8-bit data are respectively output from the output pins 24 and 29 via the selectors 30 and 31.

Whether the core circuit 10 has predetermined functions or not is determined by sequentially changing the test circuit to be supplied to the input pins 20 and 25 and checking the data output from the output pins 24 and 29 every time.

After the functions of the core circuit 10 are confirmed through the functional test, the mode signal MOD is set to the normal mode. As a result, the selectors 22 and 27 are switched to the second input side, thus connecting the CPU 1 to the DRAM 2 via the core circuit 10.

As described above, the memory control circuit according to the first embodiment has the extension circuits 21 and 26 each of which extends 8-bit test data to 32-bit data, and the degeneration circuits 23 and 32 each of which compresses 32-bit data to 8-bit data. This structure can make the number of input pins 20 and 25 and output pins 24 and 29 for a functional test significantly smaller than the actual data width, thus contributing to miniaturization of IC packages.

The memory control circuit further has the selectors 30 and 31 which select lower 8 bits in 32-bit data output from the core circuit 10 and output the selected 8-bit data to the output pins 24 and 29, respectively. This brings about an advantage such that the function of the control register 11 in the core circuit 10 can be checked.

Figure 4:
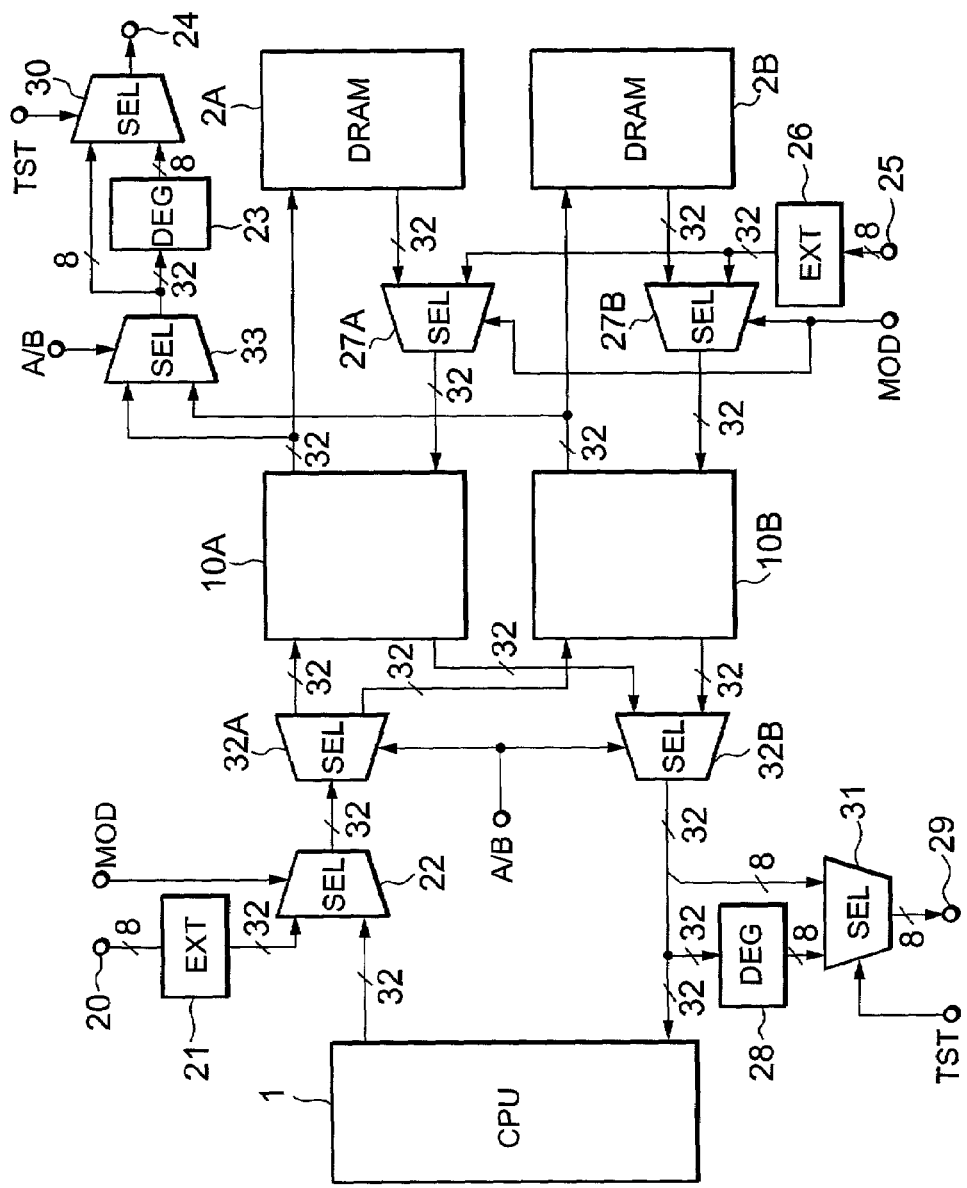
FIG. 4 is a block diagram of a memory control circuit showing a second embodiment of the invention.

FIG. 4 is a block diagram of a memory control circuit showing a second embodiment of the invention. Like or same reference symbols are given to those components that are the same as the corresponding components in FIG. 4.

This memory control circuit has two DRAMs 2A and 2B connected to the CPU 1, two core circuits 10A and 10B which respectively control the DRAMs 2A and 2B. Selectors 32A and 32B are additionally provided between the CPU 1 and the core circuits 10A and 10B to switch the connection. Since the memory control circuit in FIG. 4 has two DRAMs 2A and 2B, there are two corresponding resistors 27A and 27B connected to the DRAMs 2A and 2B, respectively. Another selector 33 is added to connect one of the memory-side output terminals MO of the core circuits 10A and 10B to the output pins 24. The other structure is the same as that of the one in FIG. 1.

In this memory control circuit, the core circuit 10A and the DRAM 2A can be used by selecting the core circuit 10A in accordance with a switch signal A/B to be supplied to the selectors 32A, 32B and 33. As the core circuit 10B is selected in accordance with the switch signal A/B, the core circuit 10B and the DRAM 2B can be used. In the functional test of the core circuits 10A and 10B, the input pins 20 and 25 and the output pins 24 and 29 can be used commonly.

The other operation is the same as that of the memory control circuit in FIG. 1, and the same advantage as obtained in the first embodiment is demonstrated for a plurality of DRAMs 2A and 2B.

The invention is not limited to the embodiments, but may be modified in various forms. Some of the modifications will be discussed below.

(a) The data width (32 bits) between the CPU 1 and the core circuit 10 and the data width (8 bits) of the input pins 20 and 25 and the output pins 24 and 29 for a functional test are not limited to the illustrated widths.

(b) The number of DRAMs 2 to be connected to the CPU 1 is not limited to one or two. Three or more DRAMs 2 can be controlled by increasing the number of selection points of the selectors 32 and 33 in FIG. 3.

(c) Depending on the structure of the core circuit 10, one of the selector 30 on the DRAM 2 side or the selector 31 on the CPU 1 side to read out the contents of the control register 11 can be eliminated.

As elaborated above, a memory control circuit according to the invention has an extension circuit for extending m-bit test data to n-bit data and a degeneration circuit for compressing n-bit data to m-bit data. This can make it possible to reduce the number of input pins and output pins for inputting and outputting test data.

Further, the memory control circuit has a second selection section which selects compressed lower m-bit data or lower m-bit data in n-bit data based on a switch signal. This can ensure writing and reading tests on the control register where information needed to control the memory is set.

What is claimed is:

1. A memory control circuit for controlling writing and reading of data in and from a memory to be controlled based on an address signal and a control signal given from a central processing unit, comprising:
    a control register having a memory capacity of m bits or smaller for setting information necessary for controlling said memory;
    a plurality of input pins to which m-bit test data is input in parallel;
    an extension circuit for extending said data input to said input pins to n-bit data;
    a first selection circuit for selectively inputting n-bit data supplied from said extension circuit or said central processing unit based on a mode signal to switch between a test mode and a normal mode;
    a degeneration circuit for compressing n-bit data to be output in parallel to said central processing unit to m-bit data;
    a second selection circuit for selecting m-bit data compressed by said degeneration circuit or lower m-bit data in n-bit data to be output to said central processing unit based on a switch signal; and
    a plurality of output pins for outputting the m-bit data selected by said second selection circuit in parallel, wherein m<n.

2. A memory control circuit according to claim 1, wherein the m-bit is 8-bit and the n-bit is 32-bit.

3. A memory control circuit according to claim 1, wherein the extension circuit is a wired OR circuit.

4. A memory control circuit according to claim 1, wherein the degeneration circuit includes a plurality of gate circuits.

5. A memory control circuit connected between a central processing unit (CPU) and a memory each of which outputs and receives data of a first bits, the memory control circuit comprising:
    a core circuit for conducting a refresh control, a precharge control and an access control of the memory, the core circuit having a first input terminal and a first output terminal;
    a first selection circuit having a first input terminal connected to the CPU, a second input terminal, and an output terminal connected to the first input terminal of the core circuit, the first selection circuit selecting input in response to a mode signal;
    a first test data input terminal receiving a first test data of a second bits that is smaller than the first bits;
    a first extension circuit connected between the first test data input terminal and the second input terminal of the first selection circuit, the first extension circuit extending the first test data of the second bits to a first extended test data of the first bits;
    a first degeneration circuit connected to the first output terminal of the core circuit, the first degeneration circuit compressing data of the first bits received from the core circuit to a first output data of the second bits; and
    a second selection circuit having a first input terminal connected to the first output terminal of the core circuit, a second input terminal connected to the first degeneration circuit and an output terminal, the second selection circuit selecting input in response to a test signal.

6. A memory control circuit according to claim 5, wherein the core circuit includes a register being capable of storing data of the second bits.

7. A memory control circuit according to claim 5, wherein the first bits is 32 bits and the second bits is 8 bits.

8. A memory control circuit according to claim 5, wherein the extension circuit is a wired OR circuit.

9. A memory control circuit according to claim 5, wherein the degeneration circuit includes a plurality of gate circuits.

10. A memory control circuit according to claim 5, wherein the core circuit further comprising a second input terminal and a second output terminal.

11. A memory control circuit according to claim 10, further comprising:
    a third selection circuit having a first input terminal connected to the memory, a second input terminal and an output terminal connected to the second input terminal of the core circuit, the third selection circuit selecting input in response to the mode signal;
    a second test data input terminal receiving a second test data of the second bits;
    a second extension circuit connected between the second test data input and the second input terminal of the third selection circuit, the second extension circuit extending the second test data to a second extended test data of the first bits;
    a second degeneration circuit connected to the second output terminal of the core circuit, the second output terminal of the core circuit, a second input terminal connected to an output of the second generation circuit and an output terminal, the fourth selection circuit selecting input in response to the test signal.

12. A memory control circuit connected to a central processing unit (CPU), a first memory and a second memory each of which outputs and receives data of a first bits, the memory control circuit comprising:
    a first core circuit for conducting a refresh control, a precharge control and an access control of the first memory, the first core circuit having a first input terminal and a first output terminal;
    a second core circuit for conducting a refresh control, a precharge control and an access control of the second memory, the second core circuit having a first input terminal and a first output terminal;
    a first selection circuit having a first output terminal connected to the first input terminal of the first core circuit, a second output terminal connected to the first input terminal of the second core circuit and an input terminal, the first selection circuit selecting output in response to a memory selection signal;
    a second selection circuit having a first input terminal connected to the CPU, a second input terminal, and an output terminal connected to the input terminal of the first selection circuit, the second selection circuit selecting input in response to a mode signal;

a first test data input terminal receiving a first test data of a second bits that is smaller than the first bits;

a first extension circuit connected between the first test data input terminal and the second input terminal of the second selection circuit, the first extension circuit extending the first test data of the second bits to a first extended test data of the first bits;

a third selection circuit having a first input terminal connected to the first output terminal of the first core circuit, a second input terminal connected to the first output terminal of the second core circuit and an output terminal, the third selection circuit selecting in one of an output of the core circuit and an output of the second core circuit in response to the memory selection signal;

a first degeneration circuit connected to the output terminal of the third selection circuit, the first degeneration circuit compressing data of the first bits received from the output terminal of the third selection circuit to a first output data of the second bits; and a fourth selection circuit having a first input terminal connected to the output terminal of the third selection circuit, a second input terminal connected to the first degeneration circuit and an output terminal, the fourth selection circuit selecting input in response to a test signal.

13. A memory control circuit according to claim 12, wherein each of the core circuits includes a register being capable of storing data of the second bits.

14. A memory control circuit according to claim 12, wherein the first bits is 32 bits and the second bits is 8 bits.

15. A memory control circuit according to claim 12, wherein the first extension circuit is a wired OR circuit.

16. A memory control circuit according to claim 12, wherein the first degeneration circuit includes a plurality of gate circuits.

17. A memory control circuit according to claim 12, wherein each of the core circuits further comprising a second input terminal and a second output terminal.

18. A memory control circuit according to claim 17, further comprising:

a fifth selection circuit having a first input terminal connected to the first memory, a second input terminal and an output terminal connected to the second input terminal of the first core circuit, the sixth selection circuit selecting input in response to the mode signal;

a sixth selection circuit having a first input terminal connected to the second memory, a second input terminal and an output terminal connected to the second input terminal of the second core circuit, the sixth selection circuit selecting input in response to the mode signal;

a second test data input terminal receiving a second test data of the second;

a second extension circuit connected to the second test data input terminal, the second input terminal of the fifth selection circuit and the second input terminal of the sixth selection circuit, the second extension circuit extending the second test data to a second extended test data of the first bits;

a seventh selection circuit having a first input terminal connected to the second output terminal of the first core circuit, a second input terminal connected to the second output terminal of the second core circuit and an output terminal, the seventh selection circuit selecting input in response to the memory selection signal;

a second degeneration circuit connected to the output terminal of the seventh selection circuit, the second degeneration circuit compressing data of the first bits received from the core circuits to a second output data of the second bits; and a eighth selection circuit having a first input terminal connected to the output terminal of the seventh selection circuit, a second input terminal connected to the second degeneration circuit and an output terminal, the eighth selection circuit selecting input in response to the test signal.

* * * * *